United States Patent
Duan et al.

(10) Patent No.: US 12,025,660 B2
(45) Date of Patent: Jul. 2, 2024

(54) SYSTEM OF PERFORMING BOUNDARY SCAN TEST ON PIN THROUGH TEST POINT AND METHOD THEREOF

(71) Applicant: Inventec (Pudong) Technology Corporation, Shanghai (CN)

(72) Inventors: Qiu-Yue Duan, Shanghai (CN); Xin-Ying Xie, Shanghai (CN); Ben Han, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 31 days.

(21) Appl. No.: 17/948,703

(22) Filed: Sep. 20, 2022

(65) Prior Publication Data

US 2024/0094292 A1   Mar. 21, 2024

(30) Foreign Application Priority Data

Sep. 5, 2022   (CN) .......................... 202211078524.3

(51) Int. Cl.
*G01R 31/3185* (2006.01)
*G01R 31/28* (2006.01)

(52) U.S. Cl.
CPC . *G01R 31/318536* (2013.01); *G01R 31/2818* (2013.01); *G01R 31/318533* (2013.01)

(58) Field of Classification Search
CPC .... G01R 31/318536; G01R 31/318533; G01R 31/2818
USPC ................................. 714/727, 733, 736, 742
See application file for complete search history.

(56) References Cited

U.S. PATENT DOCUMENTS

| | | | |
|---|---|---|---|
| 7,406,642 B1* | 7/2008 | Lau ................. | G01R 31/318533 714/734 |
| 9,874,607 B1* | 1/2018 | Kuit ....................... | H03M 1/109 |
| 11,567,130 B1* | 1/2023 | Trock ................. | G01R 31/3177 |
| 2001/0052095 A1* | 12/2001 | Ryan ................ | G01R 31/31705 714/724 |
| 2004/0068675 A1* | 4/2004 | Liu .................... | G01R 31/2815 714/27 |
| 2005/0242836 A1* | 11/2005 | Goetting ............ | G01R 31/3167 326/39 |
| 2005/0242980 A1* | 11/2005 | Collins .......... | G01R 31/318555 341/155 |

(Continued)

FOREIGN PATENT DOCUMENTS

WO   WO-9722013 A1 * 6/1997   ..... G01R 31/318572

*Primary Examiner* — John J Tabone, Jr.
(74) *Attorney, Agent, or Firm* — David R. Stevens; Stevens Law Group

(57) ABSTRACT

A system of performing boundary scan test on pin through test point and a method thereof are disclosed. When an under-test pin of a target connector is determined to be unable to perform a boundary scan test, a test point connected to and closest to the under-test pin is searched, a test signal is transmitted to a target connector, a result signal from the target connector in response to the test signal is received, an expected result and the result signal are compared to generate a test result, so that a boundary scan function can be applied to test a connector of a computer product, to achieve the technical effect of providing a better test range and a better test coverage to improve test efficiency and reduce test cost, compared to conventional boundary scan test.

18 Claims, 5 Drawing Sheets

(56) References Cited

U.S. PATENT DOCUMENTS

| | | | | |
|---|---|---|---|---|
| 2011/0204910 A1* | 8/2011 | Suto | ............... | G01R 31/2815 |
| | | | | 29/829 |
| 2019/0178934 A1* | 6/2019 | Song | ............... | G01R 31/31855 |
| 2021/0072312 A1* | 3/2021 | Mu | ............... | G06F 13/4027 |
| 2022/0404412 A1* | 12/2022 | Van Den Eijnden | ............... | |
| | | | | G01R 31/2803 |
| 2023/0297481 A1* | 9/2023 | Zhang | ............... | G11C 29/56 |
| | | | | 714/30 |
| 2023/0400511 A1* | 12/2023 | Zhao | ............... | G01R 31/31715 |

* cited by examiner

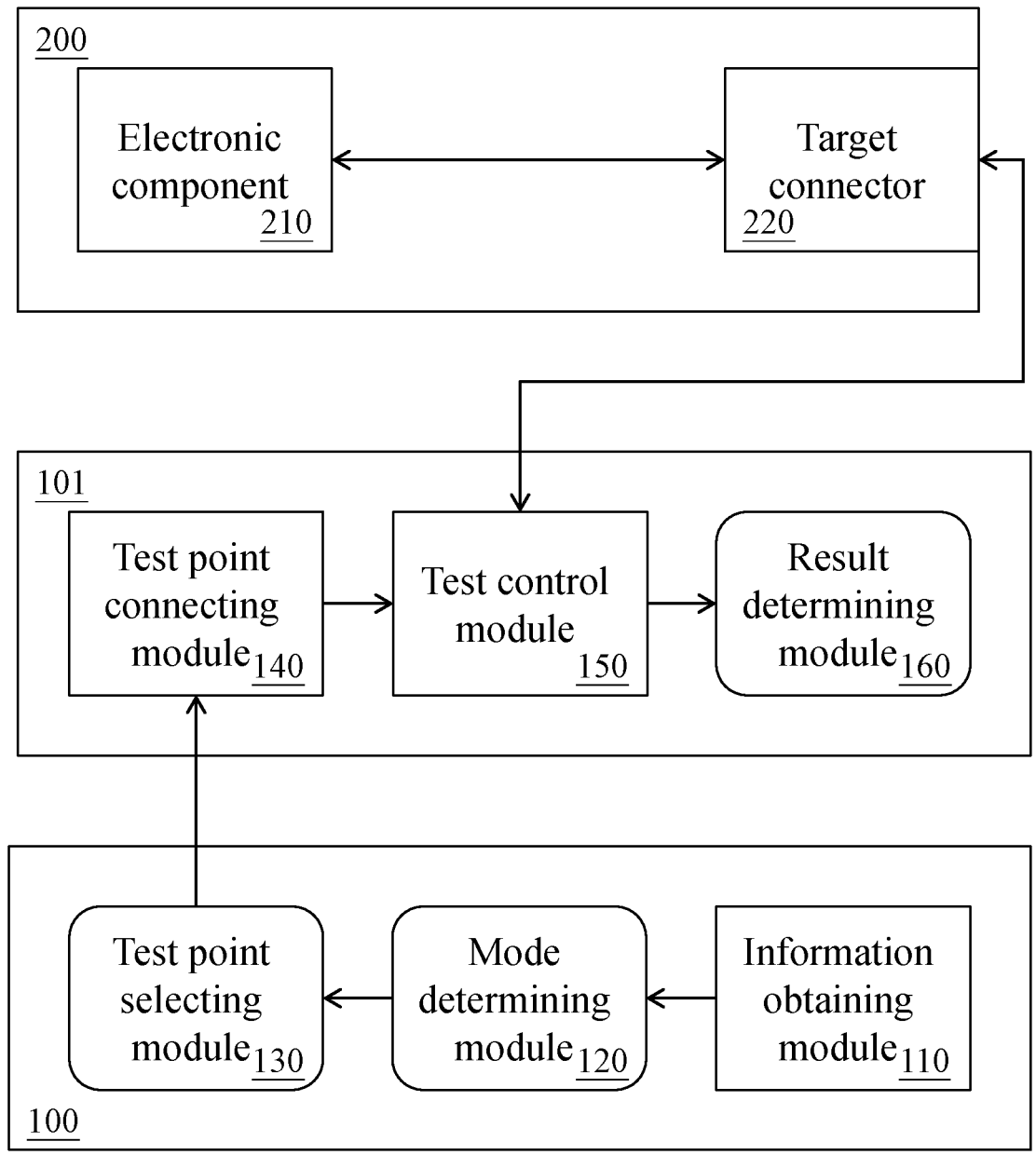
[Fig. 1A]

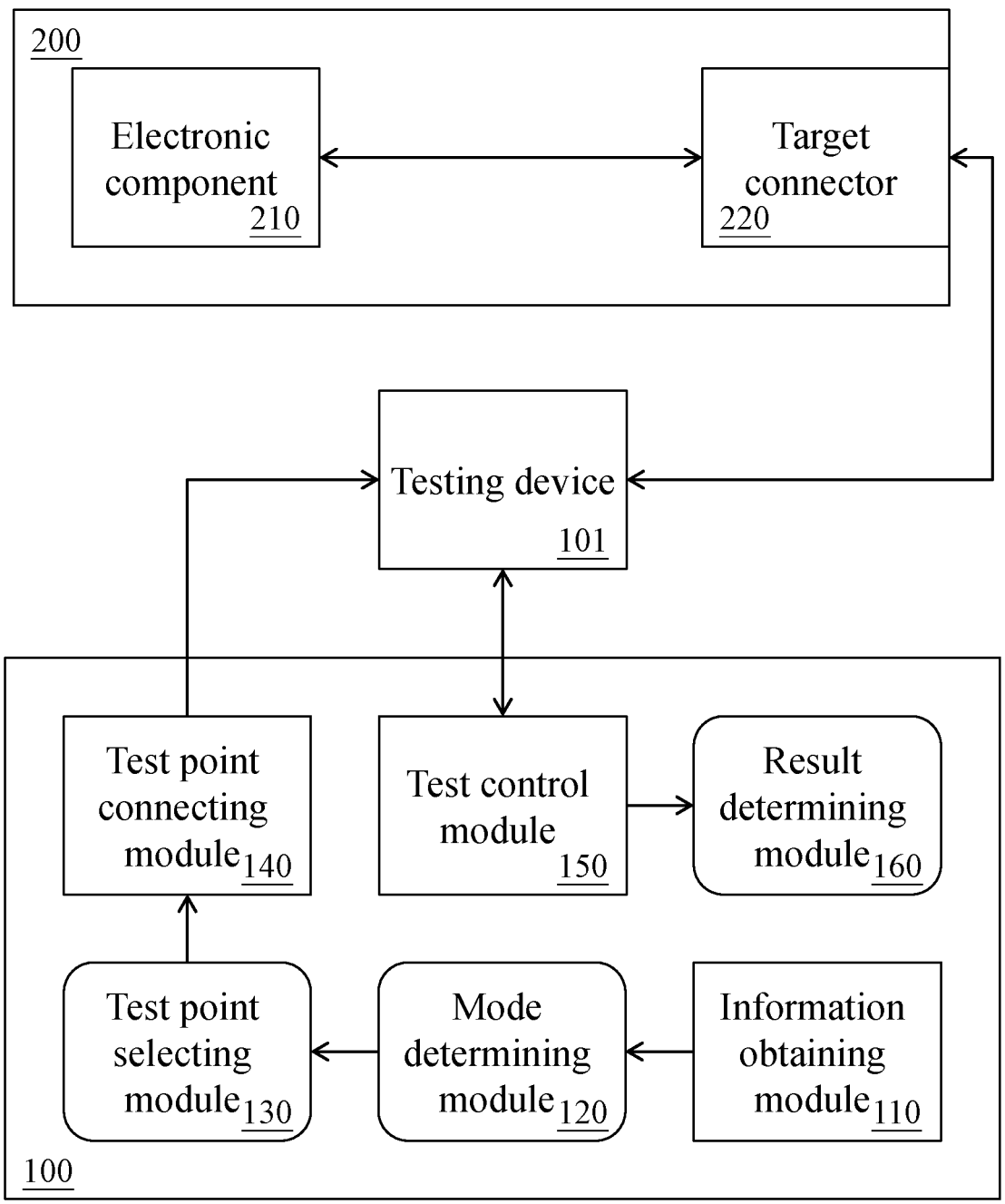
[Fig. 1B]

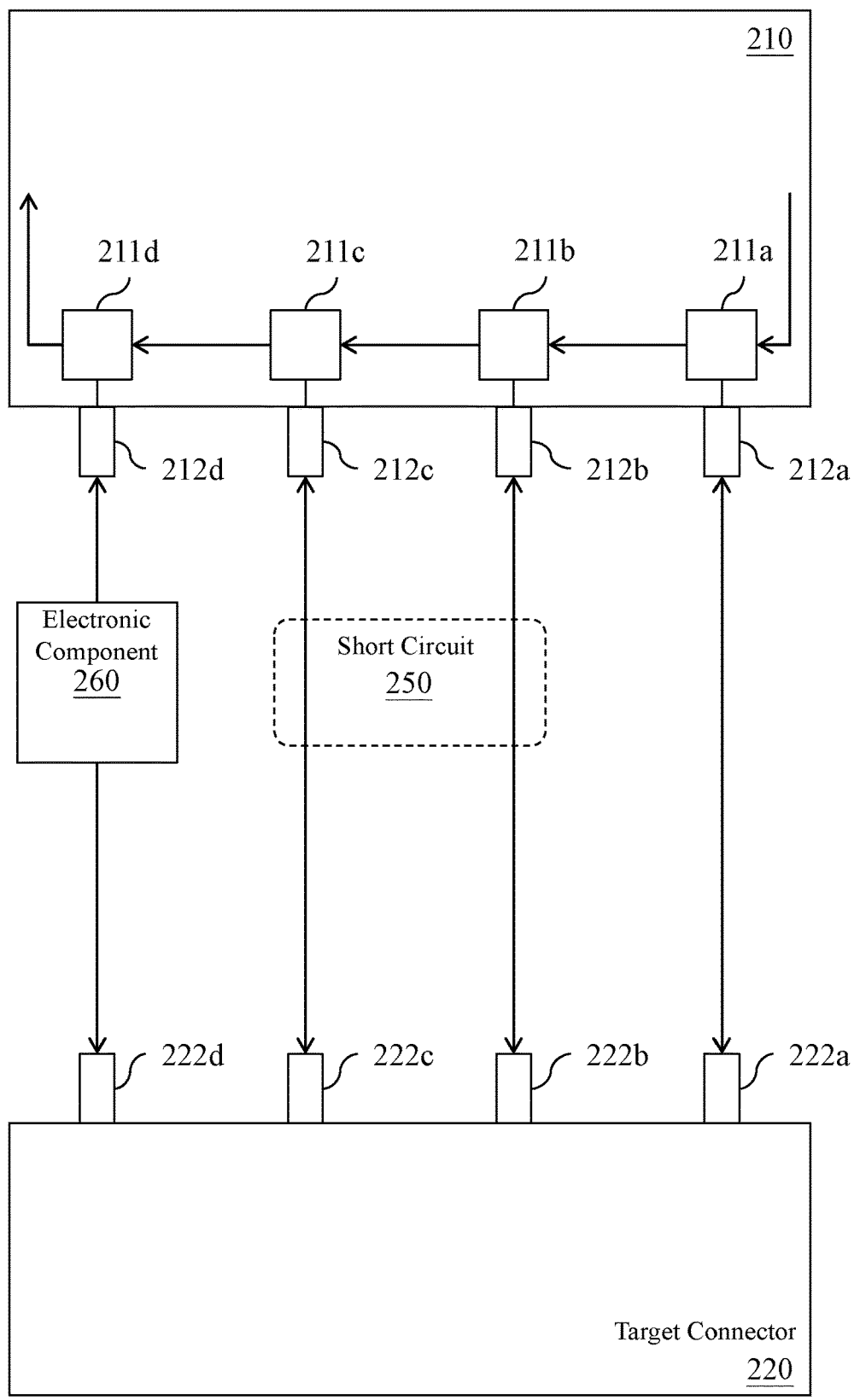
【Fig. 2】

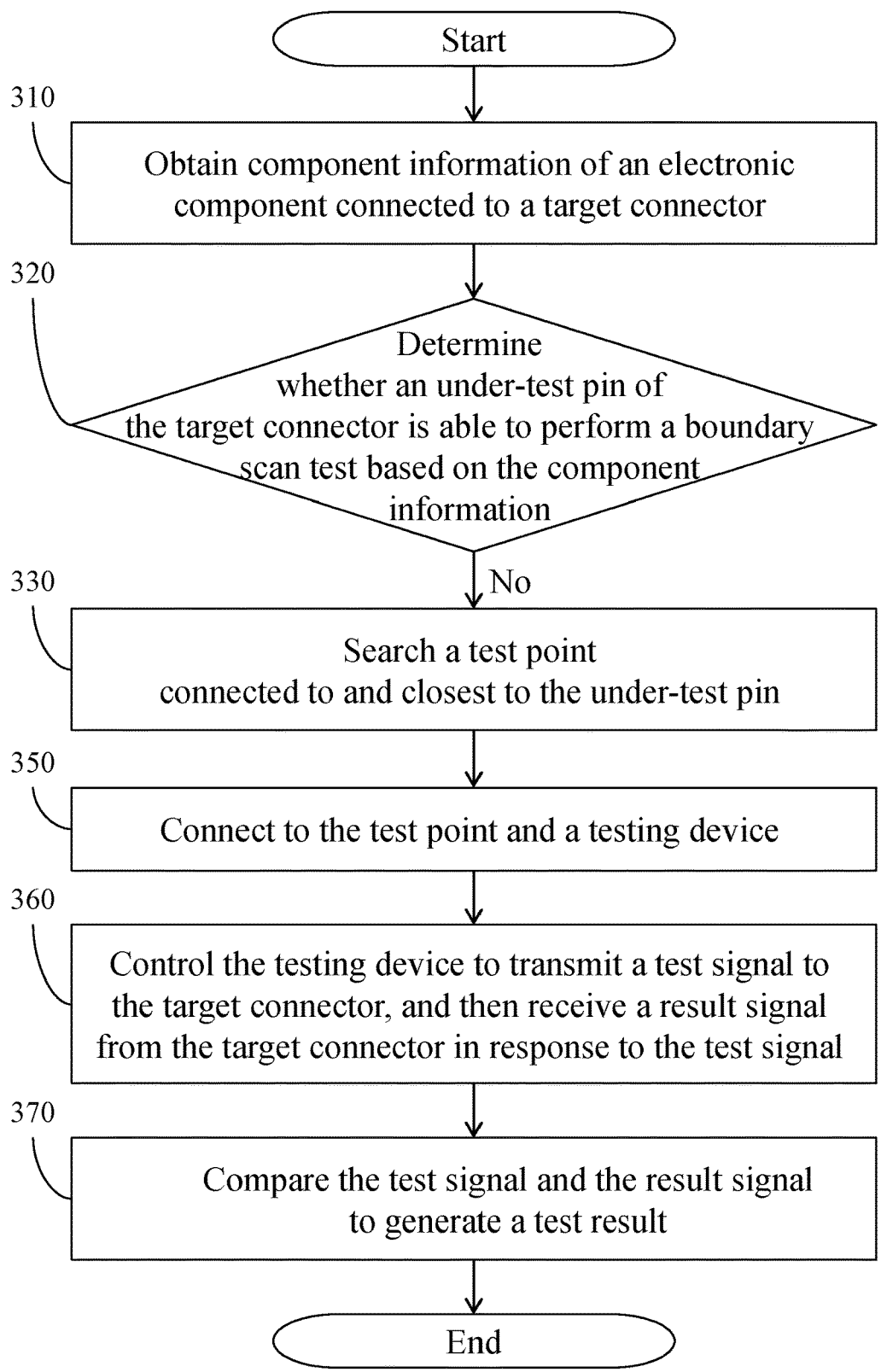
[Fig. 3A]

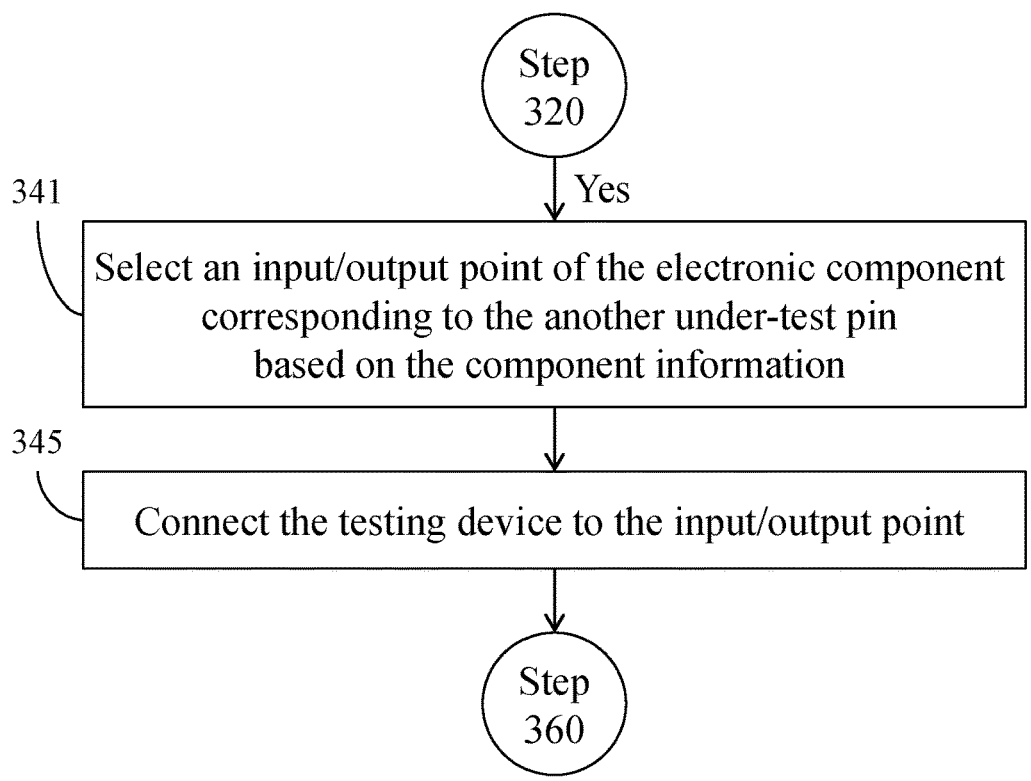
【Fig. 3B】
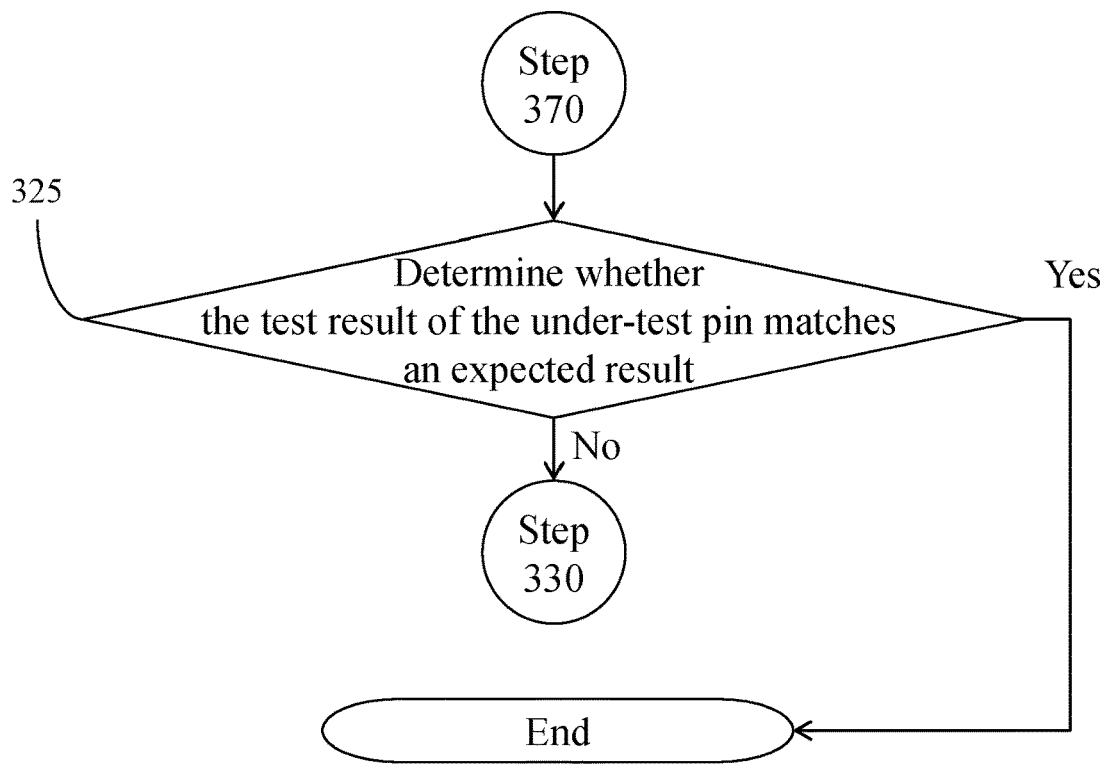
【Fig. 3C】

SYSTEM OF PERFORMING BOUNDARY SCAN TEST ON PIN THROUGH TEST POINT AND METHOD THEREOF

CROSS-REFERENCE TO RELATED APPLICATION

This application claims the benefit of Chinese Application Serial No. 202211078524.3, filed Sep. 5, 2022, which is hereby incorporated herein by reference in its entirety.

BACKGROUND OF THE INVENTION

1. Field of the Invention

The present invention relates to a test system and a method thereof, and more particularly to a system of performing boundary scan test on a pin through a test point and a method thereof.

2. Description of the Related Art

Industry 4.0 (also known as the fourth industrial revolution) is not just creation of new industrial technologies, but focuses on the integration of existing industrial technologies, sales processes and product experience, so as to build a smart factory with adaptability, resource efficiency and ergonomics through artificial intelligence (AI) technology, and integrate customers and business partners in the business process and value process to provide perfect after-sales service, thereby establishing a new intelligent industrial world with perception consciousness.

With the wave of the Industry 4.0 sweeping the world, manufacturers are all using smart manufacturing to optimize production transformation and enhance competitiveness. The smart manufacturing is to realize the intelligent product design, manufacturing, and enterprise management and service based on sensing technology, network technology, automation technology and AI through the processes of perception, human-computer interaction, decision-making, execution and feedback.

The electronic assembly industry has characteristics of small profits but quick turnover and fierce product price competition, so the manufacturers in the electronic assembly industry always pursue more effective control and optimization of raw materials and production tools, thereby maximizing the efficiency of factory production resources. For example, a boundary scan test solution is applied to test computer products.

The conventional boundary scan test solution must work with a connector, and a boundary scan component (such as CPU) which is electrically connected to a motherboard and normally supports the boundary scan function.

However, for some computer products such as notebook computers, the boundary scan component configured on the computer product does not fully support the boundary scan function, so the under-test connectors on the computer product may connect to non-boundary scan components, and it will cause failure of the conventional boundary scan test solution in effectively applying the boundary scan function to test connectors.

According to above-mentioned contents, what is needed is to develop an improved solution to solve the problem that the computer products are unable to use boundary scan functions to test connectors.

SUMMARY OF THE INVENTION

An objective of the present invention is to disclose a system of performing boundary scan test on pin through test point and a method thereof, to solve the conventional technology problem that the computer products are unable to use boundary scan functions to test connectors.

In order to achieve the objective, the present invention provides a system of performing boundary scan test on pin through test point, and the system at least includes a testing device and a controlling device. The controlling device includes an information obtaining module, a mode determining module, a test point selecting module, a test point connecting module and a test control module. The information obtaining module is configured to obtain component information of an electronic component connected to a target connector, wherein the target connector and the electronic component are disposed on the circuit board. The mode determining module is configured to determine whether an under-test pin of the target connector is able to perform a boundary scan test based on the component information. When the mode determining module determines that the under-test pin is unable to perform the boundary scan test, the test point selecting module searches a test point which is connected to and closest to the under-test pin. The test point connecting module is configured to connect the test point to the testing device. The test control module is configured to control the testing device to transmit a test signal to the target connector and then receive a result signal generated by the circuit board from the target connector in response to the test signal. The result determining module is configured to compare an expected result corresponding to the test signal and the result signal to generate a test result.

In order to achieve the objective, the present invention provides a system of performing boundary scan test on pin through test point, and the system at least includes a controlling device and a testing device. The controlling device includes an information obtaining module, a mode determining module, and a test point selecting module. The information obtaining module is configured to obtain component information of an electronic component connected to a target connector, the target connector and the electronic component are disposed on a circuit board. The mode determining module is configured to determine whether an under-test pin of the target connector is able to perform the boundary scan test, based on the component information. When the mode determining module determines that the under-test pin is unable to perform the boundary scan test, test point selecting module searches a test point connected to and closest to the under-test pin.

The testing device includes a test point connecting module, a test control module and a result determining module. The test point connecting module is configured to connect the test point to the testing device. The test control module is configured to transmit a test signal to the target connector, and receive a result signal generated by the circuit board from the target connector in response to the test signal. The result determining module is configured to compare an expected result corresponding to the test signal and the result signal to generate a test result.

In order to achieve the objective, the present invention provides a method of performing boundary scan test on pin through test point, at least includes steps of: obtaining component information of an electronic component connected to a target connector, the target connector and the electronic component are disposed on a circuit board; when an under-test pin of the target connector is determined to be unable to perform a boundary scan test based on the component information, searching a test point connected to and closest to the under-test pin; connecting to the test point and a testing device; controlling the testing device to transmit a test signal to the target connector, and then receive a result signal generated by the circuit board from the target connector in response to the test signal; comparing an expected result corresponding to the test signal and the result signal to generate a test result.

According to the above-mentioned system and method of the present invention, the difference between the system and method of the present invention and the conventional technology is that, in the present invention, when the under-test pin of the target connector is determined to be unable to perform the boundary scan test, the test point connected to and closest to the under-test pin is searched, the test signal is transmitted to the target connector, the result signal from the target connector in response to the test signal is received, an expected result and the result signal are compared to generate the test result, so that the conventional problem can be solved, to achieve the technical effect of providing a better test range and a better test coverage to improve test efficiency and reduce test cost, compared to conventional boundary scan test.

BRIEF DESCRIPTION OF THE DRAWINGS

The structure, operating principle and effects of the present invention will be described in detail by way of various embodiments which are illustrated in the accompanying drawings.

FIG. 1A is a structural view of an embodiment of a system of performing boundary scan test on pin through test point, according to the present invention.

FIG. 1B is a structural view of another embodiment of a system of performing boundary scan test on pin through test point, according to the present invention.

FIG. 2 is a schematic view of a target connector connected to an electronic component, according to an embodiment of the present invention.

FIG. 3A is a flowchart of a method of performing boundary scan test on pin through test point, according to the present invention.

FIG. 3B is a flowchart of an additional part of a method of performing boundary scan test through test point of under-test pin, according to the present invention.

FIG. 3C is a flowchart of a method of testing the under-test pin again, according to the present invention.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

When at least one under-test pin of a connector is determined to be unable to directly use the boundary scan test, the system and method of the present invention can continuously use the boundary scan to test the connector through a test point and an under-test pin able to use the boundary scan test; the test point corresponds to the under-test pin which is unable to directly use the boundary scan test and is located between the connector and the electronic component.

The operation of a system of the present invention will be described in the following paragraphs with reference to FIG. 1A, which is a structural view of a system of performing boundary scan test on pin through test point according to the present invention. As shown in FIG. 1A, the system of the present invention includes a controlling device 100 and a testing device 101. In an embodiment, the controlling device 100 can be a computing device, and the controlling device 100 can be connected to the testing device 101 through physical connection wire or wired network, or wireless network to transmit and exchange data or signal.

The controlling device 100 determines whether each pin of the target connector 220 on a circuit board 200 is able to perform a boundary scan test, and select a connection location for testing the pins of the target connector 220 based on a determination result. In an embodiment, the controlling device 100 includes an information obtaining module 110, a mode determining module 120, and a test point selecting module 130.

The information obtaining module 110 obtains component information of an electronic component 210, which is disposed on the circuit board 200 and connected to the target connector 220. The component information obtained by the information obtaining module 110 includes internal information of the electronic component 210, such as the information about whether the electronic component 210 includes boundary scan cells and connection pins corresponding to the boundary scan cells. The component information can include external connection information of the electronic component 210, such as the information about other electronic component(s) directly and indirectly connected to the connection pins of the electronic component 210; however, the content of the component information is not limited to above-mentioned examples.

In general, the information obtaining module 110 reads the component information of the electronic component 210 by accessing a prebuilt file or database based on component identification data of the electronic component 210; however, the present invention is not limited to above-mentioned examples. The component identification data can include, but not limited to, the data for identifying the electronic component 210, such as a model number, a reference number, and/or a serial number. In an embodiment, the information obtaining module 110 captures an image containing the component identification data of the electronic component 210, and performs image recognition to obtain the component identification data of the electronic component 210 from the captured image; in another embodiment, the information obtaining module 110 provides a user to input the component identification data of the electronic component 210. However, the manner of obtaining the component identification data by the information obtaining module 110 is not limited to above-mentioned examples. Similarly, the information obtaining module 110 also can obtains the component identification data of the target connector 220.

The mode determining module 120 determines whether an under-test pin of the target connector 220 on the circuit board 200 is able to perform a boundary scan test based on the component information obtained by the information obtaining module 110. In more detail, the mode determining module 120 determines whether the under-test pin of the target connector 220 is directly connected to the electronic component 210 based on the component information, and also determines whether a connection pin of the electronic component 210 connected to the under-test pin of the target connector 220 is corresponding to a boundary scan cell inside the electronic component 210 based on the component information. When a specific under-test pin of the target connector 220 is directly connected to the electronic component 210, and one or more of the connection pin of the electronic component 210 connected to the specific under-test pin are corresponding to the corresponding boundary scan cells inside the electronic component 210, the mode determining module 120 determines that the specific under-test pin of the target connector 220 directly connected to the electronic component 210 is able to perform the boundary scan test; otherwise, the mode determining module 120 determines that the specific under-test pin is unable to perform the boundary scan test. As shown in FIG. 2, the connection pins 212a—d of the electronic component 210 are corresponding to the corresponding boundary scan cells 211a—d, respectively; the connection pins 212a~c are directly connected to the under-test pins 222a~c of the target connector 220, respectively, and the connection pin 212d is indirectly connected to the under-test pin 222d of the target connector 220 through the electronic component 260 not supporting boundary scan function. As a result, the mode determining module 120 determines that the under-test pins 222a~c are able to perform the boundary scan test and the under-test pin 222d is unable to perform the boundary scan test.

In an embodiment, when the mode determining module 120 determines that the specific under-test pin of the target connector 220 is able to perform the boundary scan test but the test result of the specific under-test pin does not match an expected result, it indicates that the specific under-test pin does not pass the boundary scan test, and the mode determining module 120 determines that the specific under-test pin is unable to perform the boundary scan test.

When the mode determining module 120 determines that one or more of the under-test pin of the target connector 220 is unable to perform the boundary scan test, the test point selecting module 130 searches a test point connected to and closest to the under-test pin unable to perform the boundary scan test, respectively.

In more detail, the test point selecting module 130 obtains location information of the one or more test point on a connection line connecting the electronic component 210 and the under-test pin, which is unable to perform the boundary scan test; in the present invention, the location information of the test point is also denoted as the test-point location information. The test point selecting module 130 selects a test point connected to and closest to the under-test pin, based on the obtained test-point location information; for example, the test point selecting module 130 can access the prebuilt file or database, to read the test-point location information of the test point on the connection line between the electronic component 210 and the under-test pin, where the electronic component 210 can be indirectly connected to the under-test pin which is unable to perform the boundary scan test, or the test point selecting module 130 obtains the test-point location information of the test point on the connection line connected between the under-test pin and the connection pin of the electronic component 210 not corresponding to the boundary scan cell, and the test point selecting module 130 selects one of the obtained test-point location information, to select the test point corresponding to the selected test-point location information.

The test-point location information obtained by the test point selecting module 130 indicates the corresponding test point, for example, the test-point location information records the locations of the test points on the circuit board 200; the test-point location information can indicate a distance between the test point and the under-test pin connected thereto. In an embodiment, the test point selecting module 130 captures the image containing the test point and the target connector 220 based on the locations of the test points and the target connector 220 on the circuit board 200, and performs an image recognition on the captured image to obtain the connection pins of the electronic component 210 and the under-test pins of the target connector 220, to calculate straight-line distances between the connection pins of the electronic component 210 and the under-test pins of the target connector 220. In another embodiment, the test point selection module 130 also can perform the image recognition to obtain the connection lines connecting the connection pins of the electronic component 210 and the under-test pins of the target connector 220, to estimate circuit lengths of the connection lines connecting the connection pins of the electronic component 210 and the under-test pins of the target connector 220 based on a scale of the captured image. However, the manner of obtaining the distance between the test point and the under-test pin connected thereto by the test point selecting module 130 is not limited to above-mentioned examples.

In an embodiment, when the test point selecting module 130 fails to obtain the test-point location information of the connection line connecting the under-test pin and the electronic component, the test point selecting module 130 can access the prebuilt file or database to read the soldering pad information of soldering pads (not shown in figures) corresponding to the target connector 220, to obtain the test point on the soldering pad corresponding to the target connector 220 and connected to the under-test pin based on the read soldering pad information. The soldering pad information indicates the corresponding soldering pad, and can record the connection relationship between each connection nod of the corresponding soldering pad and each under-test pin of the target connector 220, that is, the soldering pad information records the under-test pin connected to each connection nod.

When the mode determining module 120 determines that the under-test pin of the target connector 220 is able to perform the boundary scan test, the test point selecting module 130 selects the input/output point of the electronic component 210 corresponding to the under-test pin based on the component information obtained by the information obtaining module 110, and uses the selected input/output point as the test point of the under-test pin.

The testing device 101 is connected to the circuit board 200 to test the connected circuit board 200. In an embodiment, the testing device 101 includes a test control module 150, a result determining module 160, and a test point connecting module 140; in this embodiment, the test point connecting module 140 is optional.

The test point connecting module 140 is connected to the testing device 101, and the test point selected by the test point selecting module 130. For example, the test point connecting module 140 includes a robot arm and a gripping part connecting with the robot arm, which are not shown in figures, and the test point connecting module 140 controls the gripping part to grip the connection member of the testing device 101, and then controls the robot arm to make the connection member, which is gripped by the gripping part, to contact the corresponding test point, so as to connected to the testing device 101 and a test point. Alternatively, the test point connecting module 140 controls the robot arm to make the connection member gripped by the gripping part insert with or be inserted with the test point, to connect the testing device 101 to the input/output point, which is used as the test point, of the circuit board 200. However, the manner of connecting the test-point connection module 140 to the test point and the testing device 101 is not limited to above-mentioned examples.

The test control module 150 generates a test signal and an expected result corresponding to the test signal. The test control module 150 executes a program to generate the test signal and the expected result corresponding to the target connector 220 based on the component identification data of the target connector 220, and the component identification data is preset or obtained by the information obtaining module 110; in an embodiment, the test control module 150 executes a preset program to generate the test signal and the expected result. However, the manner of generating the test signal by the test control module 150 is not limited to above-mentioned examples.

The test control module 150 transmits the generated test signal after the testing device 101 is connected to the test point selected by the test point selecting module 130, to make the test signal transmit to the target connector 220 through the test point, and the test signal goes to the circuit board 200 through the target connector 220. The test control module 150 receives a result signal generated by the circuit board 200 from the target connector 220.

The result determining module 160 compares the expected result generated by the test control module 150 and the result signal received by the test control module 150, and generates a test result based on the comparison result. For example, the result determining module 160 converts the expected result and the result signal into two sets of binary data, respectively, and compares the two sets of binary data; when the two sets of binary data are the same, it indicates that all of the under-test pins of the target connector 220 pass the test; when the two sets of binary data are different from each other, it indicates that the under-test pin corresponding to the different bit in the two sets of binary data does not pass the test and the under-test pin corresponding to the-same-data bits in the two sets of binary data passes the test.

As shown in FIG. 1B, all modules of the present invention can be disposed in the controlling device 100, the testing device 101 only forwards the test signal and result signal, and in this case, after the testing device 101 receives the test signal generated by the test control module 150, the testing device 101 transmits the received test signal to the target connector 220, and transmits the result signal back to the test control module 150.

The operation of the system and method of the present invention will be described in the following paragraphs with reference to an embodiment. Please refer to FIG. 3A, which is a flowchart of a method of performing boundary scan test on pin through test point, according to the present invention. In this embodiment, the circuit board 200 is a motherboard, the target connector 220 is a USB connection interface or an HDMI connection interface, but the present invention is not limited to above-mentioned examples.

When the management personnel for a production line of the circuit board 200 wants to apply the technical solution of the present invention to test the target connector 220 disposed on the circuit board 200, the information obtaining module 110 of the controlling device 100 obtains the component information of the electronic component 210 of the circuit board 200 connected to the target connector 220 (step 310). In this embodiment, the information obtaining module 110 obtains the component information of all electronic components 210 supporting the boundary scan on the circuit board 200, such as the component information of the central processing unit.

After the information obtaining module 110 of the controlling device 100 obtains the component information of the electronic component 210, the mode determining module 120 of the controlling device 100 determines whether the under-test pin of the target connector 220 is able to perform a boundary scan test, based on the component information obtained by the information obtaining module 110 (step 320). In this embodiment, the mode determining module 120 determines, one by one, whether each electronic component 210 is directly connected to the one (or more) under-test pin of the target connector 220, based on the content recorded in the component information of the electronic component 210. When the one (or more) under-test pin of the target connector 220 is not directly connected to the electronic component 210 of the circuit board 200 supporting the boundary scan function, the mode determining module 120 determines that the one (or more) under-test pin of the target connector 220 is unable to perform the boundary scan test; otherwise, when one (or more) under-test pin of the target connector 220 is directly connected to the electronic component 210 supporting the boundary scan function, the mode determining module 120 further determines whether the connection pin connected to the one (or more) under-test pin corresponds to the boundary scan cell inside the electronic component 210. When the connection pin connected to the one (or more) under-test pin does not correspond to any boundary scan cell, the mode determining module 120 determines that the one (or more) under-test pin is unable to perform the boundary scan test; when the connection pin connected to the one (or more) under-test pin corresponds to a boundary scan cell, the mode determining module 120 determines that the one (or more) under-test pin is able to perform the boundary scan test.

After the mode determining module 120 of the controlling device 100 determines whether each under-test pin of the target connector 220 is able to perform the boundary scan test, the test point selecting module 130 of the controlling device 100 searches or selects a test point corresponding to each under-test pin of the target connector 220. In this embodiment, as shown in FIG. 3B, the test point selecting module 130 selects the input/output point (such as the connection pins 212*a*~*c*) of the electronic component 210 corresponding to the under-test pins 222*a*~*c*, which are able to perform the boundary scan test, of the target connector 220, based on the component information obtained by the information obtaining module 110 of the controlling device 100 (step 341); the test point selecting module 130 also searches the test point, which is connected to and closest to the boundary scan test of the target connector 220 unable to perform the boundary scan test (step 330), for example, the test point selecting module 130 obtains the test-point location information of the test point on a connection line connecting the under-test pin 222*d* and the electronic component 210, and selects the test point closest to the under-test pin 222*d* based on the test-point location information. When the test point selecting module 130 is unable to obtain the location information of the test points between the under-test pin 222*d* and the electronic component 210, the test point selecting module 130 obtains the soldering pad information of the soldering pad corresponding to the target connector 220, and obtains the test point of the soldering pad connected to the under-test pin 222*d* based on the obtained soldering pad information.

After the test point selecting module 130 of the controlling device 100 searches or selects the test points corresponding to the under-test pins of the target connector 220, respectively, the personnel for the production line of the circuit board 200 connects the testing device 101 to the test points searched or selected by the test point selecting module 130 (steps 345 and 350). In this embodiment, when the personnel electrically connects the connection member of the testing device 101 supporting the boundary scan function to the selected input/output points (such as the connection pins 212*a*~*c* of the electronic component 210) corresponding to the under-test pins 222*a*~*c* which are able to perform boundary scan test; the personnel can also use a probe of the testing device 101 to contact the test point which is searched by the test point selecting module 130 and corresponds to the under-test pin 222*d* unable to perform the boundary scan test, so as to connect the testing device 101 to the under-test pins of the target connector 220.

After the testing device 101 is connected to the test point searched or selected by the test point selecting module 130, the testing device 101 transmits the test signal to the target connector 220, and then receives a result signal generated by the circuit board 200 from the target connector 220 in response to the test signal (step 360). In this embodiment, when the testing device 101 is merely an intermediate device for forwarding signal, the test control module 150 of the controlling device 100 generates the control signal and an expected result, and transmits the control signal to the testing device 101 to make the testing device 101 generate a corresponding test signal, and the test control module 150 transmits the generated test signal to the under-test pins of the target connector 220 through the test point; in an embodiment, the test control module 150 generates the test signal and the expected result, and transmits the test signal to the testing device 101, and the testing device 101 transmits the received test signal to the under-test pins of the target connector 220. The circuit board 200 generates a result signal in response to test signal passing through the target connector 220. In a condition that the testing device 101 is not an intermediate device merely for forwarding signal, the test control module 150 of the testing device 101 directly generates the test signal and the expected result, and transmits the generated test signal to the under-test pins of the target connector 220 through the test points, so that the test signal passes through the target connector 220 and the circuit board 200 generates a result signal.

After the testing device 101 receives the result signal from the target connector 220, the result determining module 160 of the controlling device 100 or the testing device 101 compares the expected result generated by the test control module 150 of the controlling device 100/the testing device 101 with the received result signal, and generates the test result based on a comparison result (step 370). In this embodiment, when the connection line connecting the under-test pin 222*b* and the connection pin 212*b* and the connection line connecting the under-test pin 222*c* and the connection pin 212*c* form short circuiting 250, and the result signals corresponding to the under-test pin 222*b* and 222*c* may be different from the expected result, so that the result determining module 160 determines that the under-test pins 222*a* and 222*d* pass test and the under-test pins 222*b* and 222*c* do not pass test.

According to the above-mentioned solution of the present invention, when the under-test pin of the target connector 220 on the circuit board 200 is unable to perform the boundary scan test, the boundary scan test can be continuously performed on the target connector through the test point that is located between the target connector 220 and the electronic component 210 corresponding to the under-test pin unable to perform the boundary scan test.

In above-mentioned embodiment, as shown in FIG. 3C, after the result determining module 160 of the controlling device 100 or the testing device 101 compares the expected result with the result signal to generate the test result (step 370), the mode determining module 120 of the controlling device 100 further determines whether the test result of the under-test pin matches the expected result (step 325). When the test result of the under-test pin matches the expected result, the flow of the method of the present invention is ended; otherwise, when the mode determining module 120 determines that the under-test pin, of which the test result does not match the expected result, is unable to perform the boundary scan test, and the above-mentioned steps 330~370 are repeated, so as to test the under-test pin, of which the test result does not match the expected result, again; that is, in this embodiment, the under-test pins 222*b* and 222*c* are tested again. When the test results of the under-test pins 222*b* and 222*c* match the expected results, the result determining module 160 determines that the problem occurred on the connection lines of the under-test pins 222*b* and 222*c* and the electronic component 210 is from the connection line. When the test results of the under-test pins 222*b*/222*c* do not match the expected results again, the result determining module 160 determines that the problem of the under-test pins 222*b* and 222*c* is from pin soldering of the target connector 220.

According to above-mentioned contents, the difference between the present invention and the conventional technology is that, in the present invention, when the under-test pin of the target connector is determined to be unable to perform the boundary scan test, the test point connected to and closest to the under-test pin is searched, the test signal is transmitted to the target connector, the result signal from the target connector in response to the test signal is received, an expected result corresponding to the test signal and the result signal are compared to generate the test result. Therefore, the above-mentioned solution of the present invention is able to solve the conventional problem that the computer products are unable to use boundary scan functions to test connectors, thereby achieving the technical effect of providing a better test range and a better test coverage to improve test efficiency and reduce test cost, compared to conventional boundary scan test.

Furthermore, the above-mentioned method of the present invention can be implemented by hardware, software or a combination thereof, and can be implemented in a computer system by a centralization manner, or by a distribution manner of different components distributed in several interconnect computer systems.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A method of performing boundary scan test on pin through a test point, comprising:
   obtaining component information of an electronic component connected to a target connector, wherein the target connector and the electronic component are disposed on a circuit board;
   when an under-test pin of the target connector is determined to be unable to perform a boundary scan test based on the component information, searching a test point connected to and closest to the under-test pin;
   connecting to the test point and a testing device;
   controlling the testing device to transmit a test signal to the target connector, and then receive a result signal generated by the circuit board from the target connector in response to the test signal; and
   comparing an expected result corresponding to the test signal and the result signal to generate a test result of the target connector.

2. The method of performing boundary scan test on pin through test point according to claim 1, further comprising:
   when another under-test pin of the target connector is determined to be able to perform the boundary scan test based on the component information, selecting an input/output point of the electronic component corresponding to the another under-test pin based on the component information, and connecting the testing device to the input/output point.

3. The method of performing boundary scan test on pin through test point according to claim 1, wherein the step of determining whether the under-test pin of the target connector is able to perform the boundary scan test based on the component information, comprises:
   when determined that the electronic component is directly connected to the under-test pin and a connection pin connected to the under-test pin is corresponding to a boundary scan cell in the electronic component based on the component information, determining that the under-test pin is able to perform the boundary scan test, otherwise, determining that the under-test pin is unable to perform the boundary scan test.

4. The method of performing boundary scan test on pin through test point according to claim 1, wherein the step of determining whether the under-test pin of the target connector is able to perform the boundary scan test based on the component information, comprises:
   determining that the under-test pin is unable to perform the boundary scan test when the under-test pin is determined to be able to perform the boundary scan test but the test result of the under-test pin does not match an expected result.

5. The method of performing boundary scan test on pin through test point according to claim 1, wherein the step of searching the test point connected to and closest to the under-test pin, comprises:
   obtaining test-point location information of each test point on a connection line between the under-test pin and the electronic component, and selecting one of the test point connected to the under-test pin and closest to the under-test pin based on the test-point location information.

6. The method of performing boundary scan test on pin through test point according to claim 5, wherein the step of searching the test point connected to and closest to the under-test pin, comprises:
   when failed to obtain the test-point location information on the connection line between the under-test pin and the electronic component, obtaining soldering pad information of a soldering pad corresponding to the target connector, and obtaining the test point of the soldering pad connected to the under-test pin based on the soldering pad information.

7. A system of performing boundary scan test on pin through test point, wherein the system is configured to test a circuit board and comprises:
   a testing device; and
   a controlling device configured to:
      obtain component information of an electronic component connected to a target connector, wherein the target connector and the electronic component are disposed on the circuit board;
      determine whether an under-test pin of the target connector is able to perform a boundary scan test based on the component information;
      search a test point which is connected to and closest to the under-test pin when the controlling device determines that the under-test pin is unable to perform the boundary scan test;
      connect the test point to the testing device;
      control the testing device to transmit a test signal to the target connector and then receive a result signal generated by the circuit board from the target connector in response to the test signal; and
      compare an expected result corresponding to the test signal and the result signal to generate a test result.

8. The system of performing boundary scan test on pin through test point according to claim 7, wherein when the controlling device determines that another under-test pin of the target connector is able to perform the boundary scan test, the controlling device selects an input/output point of the electronic component corresponding to the another under-test pin based on the component information, the controlling device is configured to connect the testing device to the input/output point.

9. The system of performing boundary scan test on pin through test point according to claim 7, wherein when the controlling device determines that the electronic component is directly connected to the under-test pin and a connection pin of the electronic component connected to the under-test pin is corresponding to a boundary scan cell in the electronic component based on the component information, the controlling device determines that the under-test pin is able to perform the boundary scan test, otherwise, the controlling device determines that the under-test pin is unable to perform the boundary scan test.

10. The system of performing boundary scan test on pin through test point according to claim 7, wherein the controlling device determines that the under-test pin is unable to perform the boundary scan test when the controlling device determines that the under-test pin is able to perform the boundary scan test but the test result of the under-test pin does not match an expected result.

11. The system of performing boundary scan test on pin through test point according to claim 7, wherein the controlling device is configured to obtain test-point location information of each test point on a connection line between the under-test pin and the electronic component, and selecting one of the test point connected to the under-test pin and closest to the under-test pin based on the test-point location information.

12. The system of performing boundary scan test on pin through test point according to claim 11, wherein the controlling device is configured to obtain soldering pad information of a soldering pad corresponding to the target connector and obtain the test point of the soldering pad connected to the under-test pin based on the soldering pad information when the controlling device fails to obtain the test-point location information.

13. A system of performing boundary scan test on pin through test point, wherein the system is configured to test a circuit board and comprises:
  a controlling device comprising configured to:
    obtain component information of an electronic component connected to a target connector, the target connector and the electronic component are disposed on the circuit board; and
    determine whether an under-test pin of the target connector is able to perform the boundary scan test, based on the component information
    wherein when the controlling device determines that the under-test pin is unable to perform the boundary scan test, the controlling device searches a test point connected to and closest to the under-test pin; and
  a testing device, configured to:
    connect the test point to the testing device;
    transmit a test signal to the target connector, and then receive a result signal generated by the circuit board from the target connector in response to the test signal; and
    compare an expected result corresponding to the test signal and the result signal to generate a test result.

14. The system of performing boundary scan test on pin through test point according to claim 13, wherein when the controlling device determines that another under-test pin of the target connector is able to perform the boundary scan test, the controlling device selects an input/output point of the electronic component corresponding to the another under-test pin based on the component information, and the testing device connects the testing device to the selected input/output point.

15. The system of performing boundary scan test on pin through test point according to claim 13, wherein when the controlling device determines that the electronic component is directly connected to the under-test pin and a connection pin of the electronic component connected to the under-test pin is corresponding to a boundary scan cell in the electronic component based on the component information, the controlling device determines that the under-test pin is able to perform the boundary scan test, otherwise, the controlling device determines that the under-test pin is unable to perform the boundary scan test.

16. The system of performing boundary scan test on pin through test point according to claim 13, wherein the controlling device determines that the under-test pin is unable to perform the boundary scan test when the controlling device determines that the under-test pin is able to perform the boundary scan test but the test result of the under-test pin does not match an expected result.

17. The system of performing boundary scan test on pin through test point according to claim 13, wherein the controlling device is configured to obtain test-point location information of each test point on a connection line between the under-test pin and the electronic component, and selecting one of the test point connected to the under-test pin and closest to the under-test pin based on the test-point location information.

18. The system of performing boundary scan test on pin through test point according to claim 17, wherein the controlling device is configured to obtain soldering pad information of a soldering pad corresponding to the target connector and obtain the test point of the soldering pad connected to the under-test pin based on the soldering pad information when the controlling device fails to obtain the test-point location information.

* * * * *